(12) United States Patent
Naito et al.

(10) Patent No.: US 8,084,926 B2
(45) Date of Patent: Dec. 27, 2011

(54) AT CUT QUARTZ CRYSTAL RESONATOR ELEMENT AND METHOD FOR MANUFACTURING THE SAME

(75) Inventors: Matsutaro Naito, Minowa-machi (JP); Yoshiyuki Aoshima, Minowa-machi (JP); Kenji Komine, Chigasakishi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/953,960

(22) Filed: Nov. 24, 2010

(65) Prior Publication Data

US 2011/0068660 A1 Mar. 24, 2011

Related U.S. Application Data

(60) Continuation of application No. 12/541,223, filed on Aug. 14, 2009, now Pat. No. 7,861,389, which is a division of application No. 11/882,019, filed on Jul. 30, 2007, now Pat. No. 7,608,987.

(30) Foreign Application Priority Data

Aug. 9, 2006 (JP) ................................. 2006-217046
Mar. 29, 2007 (JP) ................................. 2007-086197

(51) Int. Cl.
*H01L 41/09* (2006.01)
(52) U.S. Cl. .......................... 310/361; 310/367; 310/348
(58) Field of Classification Search .................. 310/361, 310/348, 320, 324, 368, 354, 365, 366, 367; H01L 41/08, 41/09
See application file for complete search history.

(56) References Cited

U.S. PATENT DOCUMENTS

| | | | | |
|---|---|---|---|---|
| 4,167,686 A * | 9/1979 | Fukuyo | .......................... | 310/361 |
| 4,642,511 A * | 2/1987 | Chason et al. | ................. | 310/348 |
| 4,701,987 A | 10/1987 | Studer | | |
| 6,590,315 B2 * | 7/2003 | Beaver | .......................... | 310/348 |
| 2004/0174092 A1 | 9/2004 | Iwata | | |

FOREIGN PATENT DOCUMENTS

| | | |
|---|---|---|
| JP | A-61-189715 | 8/1986 |
| JP | A-6-104685 | 4/1994 |
| JP | A-8-216014 | 8/1996 |
| JP | A-10-032456 | 2/1998 |
| JP | A-11-355094 | 12/1999 |
| JP | A-2001-007677 | 1/2001 |
| JP | A-2001-230655 | 8/2001 |
| JP | A-2001-285000 | 10/2001 |
| JP | A-2002-271167 | 9/2002 |
| JP | A-2003-168941 | 6/2003 |
| JP | A-2003-205449 | 7/2003 |
| JP | A-2005-094410 | 4/2005 |
| JP | A-2005-277482 | 10/2005 |
| JP | A-2006-129096 | 5/2006 |
| JP | A-2006-140803 | 6/2006 |
| JP | A-2006-340023 | 12/2006 |
| JP | A-2007-129513 | 5/2007 |
| JP | A-2007-173906 | 7/2007 |

* cited by examiner

*Primary Examiner* — Thomas Dougherty
*Assistant Examiner* — Karen B Addison
(74) *Attorney, Agent, or Firm* — Oliff & Berridge, PLC

(57) ABSTRACT

An AT cut quartz crystal resonator element includes a quartz crystal element piece having an exciting part formed from an AT cut quartz crystal plate in a rectangular shape having an X-axis direction of a quartz crystal set to a long side, and an exciting electrode formed on each of front and back main surfaces of the exciting part, in which each side surface in the longitudinal direction of the exciting part is composed of two faces, an m-face of a quartz crystal and a crystal face other than the m-face.

4 Claims, 7 Drawing Sheets

AT CUT QUARTZ CRYSTAL RESONATOR ELEMENT AND METHOD FOR MANUFACTURING THE SAME

This is a Continuation of application Ser. No. 12/541,223 filed Aug. 14, 2009, which in turn is a divisional of U.S. application Ser. No. 11/882,019 filed Jul. 30, 2007. The disclosure of the prior applications is hereby incorporated by reference herein in its entirety.

BACKGROUND OF THE INVENTION

1. Technical Field

The present invention relates to an AT cut quartz crystal resonator element having a thickness-shear vibration mode as a main vibration and a method for manufacturing the same.

2. Related Art

Generally, a quartz crystal that achieves a high frequency while having stable frequency characteristics is widely adopted as a piezoelectric material for a piezoelectric device such as a resonator, an oscillator, a filter, or a sensor. Especially an AT cut quartz crystal plate is the most widely used material for a quartz crystal resonator having a thickness-shear vibration mode as a main vibration because of the characteristics that a frequency change is small compared with a temperature change around room temperature. The AT cut quartz crystal plate is cut from a quartz crystal, in which a main surface is set by rotating a surface containing an X-axis and a Z-axis around the X-axis counterclockwise from the Z-axis by an angle of 35 degrees 15 minutes.

It has been known that in the piezoelectric resonator element in a thickness-shear vibration mode, where it is formed thinner from a center portion to an end portion, is improved in the frequency characteristics such as CI value or Q value since the amount of vibration attenuation in vibration displacement distribution increases in the end portion to enhance a vibration energy trapping effect in the center portion of the resonator element. JP-A-11-355094 is an example of related art. As a result, the piezoelectric resonator element has the advantage in its capability to resonate effectively with small energy even where the piezoelectric resonator is formed thick to set a frequency low. Conversely, with respect to a comparatively high frequency, this piezoelectric resonator element has the advantage in its capability to come down in size by being set smaller than a regular size. As a shape of the resonator element exhibiting the vibration energy trapping effect, there are a convex shape that a main surface is set to a convex-curved surface, a bevel shape that an interval between a flat thick center portion and an end edge is set to a bevel, a mesa shape that a portion surrounding the flat thick center potion is made thin, and the like.

Such a method has been known to process the piezoelectric resonator element in the convex shape, that a piezoelectric element piece in a strip shape is polished through a mechanical polishing process using a barrel polishing machine or the like. JP-A-2003-205449 and JP-A-8-216014 are examples of related art. Furthermore, the following processing method has also been proposed. Namely, a main surface of the piezoelectric element piece is subjected to a wet etching in a step-by-step manner to process the main surface in a staircase shape which is closely analogous to the convex shape or this staircase shape is reshaped in the convex shape through a machining process using a sandblast, a polishing machine, or the like. JP-A-2003-168941 is an example of related art.

For the bevel shape, the following method has been known. Namely, a quartz crystal piece is processed in a similar manner by mechanical polishing using the barrel machine or is chemically processed by the wet etching using etchant. JP-A-2001-285000 is an example of related art. There is such a piezoelectric resonator that an end portion of the resonator element in the bevel shape is united with a supporting portion in a frame shape to achieve a superior mechanical strength and easy installation. JP-A-11-355094 is an example of related art.

To process the piezoelectric resonator element in the mesa shape, generally, the wet etching is performed to a piezoelectric substrate such as quartz with a patterned electrode film as a mask on a center of a main surface of the substrate, resulting in formation of the thick center portion as a resonating part and the thin surrounding portion. JP-A-2006-140803 is an example of related art. In the mesa-shaped quartz crystal resonator, it has been affirmed that flexural vibration occurring in a longitudinal direction of the substrate is one of causes for spurious response increase. Such a structure has been proposed to reduce this flexural vibration as an unnecessary wave, that a difference in a thickness between the thick center portion and the thin surrounding portion is set between 10% and 30%. JP-A-2006-340023 is an example of related art. Furthermore, such a piezoelectric resonator has been known that an exciting electrode is expanded up to an outside of a step of the thick center portion, in which an elevation changes, so as to achieve prevention of decrease in a capacity ratio, high positional accuracy of the exciting electrode, and prevention of a break in the step. JP-A-2005-94410 is an example of related art.

In the piezoelectric resonator element in the thickness-shear vibration mode, the resonating part is required to be thin in order to set the frequency high. Therefore, such a structure in an inverted mesa shape has been well known, that improves a mechanical strength by uniting a thin resonating part with a surrounding thick reinforcing frame. Furthermore, such a piezoelectric resonator has also been proposed, that is improved in reliability by forming a slit or a flute between the thin resonating part and the reinforcing frame to make it hard to transmit external forces from the reinforcing frame to the resonating part. JP-A-61-189715 and JP-A-10-32456 are examples of related art.

On the other hand, it has been well known that a resonant frequency and frequency temperature characteristics in a thickness-shear mode are highly affected by a high-order width-shear mode having a frequency approximate to that in the thickness-shear mode. Such a piezoelectric resonator has also been proposed in that a union between the thickness-shear vibration and the high-order width-shear mode is weakened by tilting an angle formed between a normal direction of a main surface of the piezoelectric substrate and a side surface in the longitudinal direction by about 3 degrees. JP-A-2001-7677 is an example of related art.

According to JP-A-2001-7677, as shown in FIGS. 7A through 7D, a quartz crystal substrate, in which an X-axis direction of a quartz is set to a long side and a Z'-direction is set to a short side, is processed from an AT cut quartz wafer using a photolithography and an etching process in a manner that an angle, which the normal direction of the main surface of the substrate and each side surface in the longitudinal direction form, is set to about 3 degrees, to be more precise, 3 degrees±30 minutes in consideration of errors in process. First, as shown in FIG. 7A, both main surfaces of an AT cut quartz crystal substrate 1 having a desired thickness are provided with masks 2a, 2b made from Cr/Au, for example. Next, where the substrate 1 is subjected to the wet etching from both surfaces, an m-face 3 and an r-face 4 as a natural face peculiar to the quartz, and a crystal face 5 that is different from these faces are exposed, as shown in FIG. 7B. The etching is further performed to pass through a part of the quartz crystal where a mask is not formed, so that the m-face and the crystal face 5 become larger because of etching anisotropy of the quartz, resulting in formation of a projection 6 on the side surface of the substrate 1, as shown in FIG. 7C. The etching is yet further performed to become an overetching until when the projection 6 disappears completely, so that such a side surface 7 in the longitudinal direction is formed, that is composed of the crystal face that is tilted at an angle of about 3 degrees with respect to the normal direction of the main surface of the substrate 1, as shown in FIG. 7D.

FIGS. 8A and 8B show the AT cut quartz crystal resonator element using the quartz crystal substrate in a strip shape, which has been processed in the above manner. In the AT cut quartz crystal substrate element 10, a pair of exciting electrodes 12a, 12b is provided onto both main surfaces of a quartz crystal element piece 11 that is formed by eliminating the masks 2a, 2b from the substrate 1 in FIG. 7D. In the quartz crystal element piece 11, the X-direction of the quartz crystal is set to a long side and the Z'-direction is set to a short side. Further, each of the side surfaces 13 in the longitudinal direction is tilted at an angle of about 3 degrees with respect to the normal direction of the main surface. Therefore, the union between the width-shear vibration mode and the thickness-shear vibration mode is set to smaller than that in the case where the tilt angle of the side surface is set to 0 degree, so that the frequency temperature characteristics can be greatly improved.

However, the aforementioned AT cut quartz crystal resonator according to JP-A-2005-94410 has a problem that an energy tapping effect cannot be obtained sufficiently in the Z'-axis direction, i.e., a width direction of the resonator element. FIG. 8C shows vibration displacement in the width direction of the AT cut quartz crystal resonator element 10 shown in FIG. 8B. As is clear from FIG. 8C, the vibration attenuation in the vibration displacement distribution is not enough at both ends in the width direction. Therefore, it becomes difficult to improve the frequency characteristics such as the CI value or the Q value. This has a big effect especially where a downsizing of the quartz crystal resonator element is pursued, since processing accuracy in outline tends to easily vary. Furthermore, a longer etching time than normal is required to perform the overetching to the quartz crystal substrate, leading to possibility of damaging the quartz crystal substrate itself.

As described above, the piezoelectric resonator element in the convex shape achieves the high energy trapping effect but has a problem that it is difficult to process the outline into a desired shape. For example, it is difficult by the mechanical process using the barrel polishing, to control the processing accuracy, resulting in a wide range of variation in a shape and a size. Furthermore, this mechanical process requires the long processing time, leading to decrease in productivity and increase in cost. Yet further, by this process, a surface layer of the quartz crystal, which has been roughened through the polishing process, is needed to be removed by the wet etching before formation of the exciting electrodes. In the barrel polishing, furthermore, since the long sides of the substrate are easily processed, it is difficult to process the substrate in the width direction into the convex shape. The process using the barrel polishing becomes more difficult as the piezoelectric resonator element comes down in size since the element becomes lighter.

The chemical processing method by the wet etching has a problem that the convex shape in an upwardly projecting manner cannot be processed. Especially the process for the staircase shape, which is closely analogous to the convex shape, requires a large number of complicated steps and difficult control, causing a possibility of leading to decrease in productivity and increase in cost instead.

On the other hand, the mesa shape is easily processed by the wet etching utilizing the photolithography and results in a small range of variation in shape, thereby being suitable for mass production. The mesa shape has an advantage in this point over the convex shape and the bevel shape described above but has a problem, due to existence of the step between the thick center portion and the thin surrounding portion, such that the unnecessary wave in the width-shear mode or the like occurs, that superposes on the main vibration in the thickness-shear mode.

SUMMARY

An advantage of this invention is to improve an AT cut quartz crystal resonator element having a long side set to an X-axis direction of a quartz crystal, in terms of frequency temperature characteristics by reducing an effect of a width-shear mode as well as in terms of an energy trapping effect especially in a Z' axis direction.

Furthermore, another advantage of the invention is to effectively eliminate an effect of an unnecessary wave which has a possibility of superposing on a main vibration, in the case of the AT cut quartz crystal resonator element in a mesa shape having a thick center potion and a thin surrounding portion.

According to an aspect of the invention, an AT cut quartz crystal resonator element includes a quartz crystal element piece having an exciting part formed from an AT cut quartz crystal plate in a rectangular shape having an X-axis direction of a quartz crystal set to a long side, and an exciting electrode formed on each of front and back main surfaces of the exciting part, in which each of both side surfaces in the longitudinal direction of the exciting part is composed of two faces, an m-face of a quartz crystal and a crystal face other than the m-face.

It has turned out that the AT cut quartz crystal resonator element, which has the side surfaces in the longitudinal direction each composed of two surfaces tilted at different angles with respect to the front and back main surfaces of the exciting part, i.e., the AT cut surface, is greatly improved in terms of a vibration energy trapping effect at both ends in a width direction. Therefore, frequency characteristics such as CI value or Q value can be improved without processing the main surface of the resonator element in a convex shape. Furthermore, since each side surface in the longitudinal direction of the resonator element is partially composed of the crystal face of the quartz making an angle of about 3 degrees with respect to a normal direction of the main surface, an effect of a width-shear mode can be reduced and thus degradation of frequency temperature characteristics due to the width-shear mode can be improved.

In terms of actual production, it is preferable that the quartz crystal face other than the m-face be set in a manner to be tilted at an angle of 3 degrees±30 minutes with respect to the normal direction of the main surface of the exciting part in consideration of errors in process, as described in JP-A-2005-94410.

In the aspect, the quartz crystal element piece has a mesa shape composed of the thick center portion and the thin surrounding portion both forming the exciting electrode, and each side surface in the longitudinal direction of the step between the thick center portion and the thin surrounding portion is composed of the m-face of the quartz crystal and the crystal face other than the m-face. In this manner, in addition to the vibration energy trapping effect of the mesa shape, the unnecessary wave in such as the width-shear mode which superposes on the main vibration can be reduced and spurious response can be decreased.

In the aspect, a difference in a thickness between the thick center portion of and the thin surrounding portion the quartz crystal element piece is set to smaller than or equal to 10% of a thickness of the thick center portion, so that the vibration energy trapping effect is reduced in some degree but the quartz crystal resonator element is not changed in that the effect of the unnecessary wave can be reduced. Furthermore, mechanical strength of the quartz crystal resonator element can be improved by setting the thin surrounding portion thicker.

According to another aspect of the invention, a method for manufacturing an AT cut quartz crystal resonator element includes processing an outline of a quartz crystal element piece by performing a wet etching to an AT cut quartz crystal plate in an outline processing, the quartz crystal element piece having an exciting part in a rectangular shape having an X-axis direction of a quartz crystal set to a long side, the exciting part having each side surface in a longitudinal direction composed of two faces, an m-face of the quartz crystal and a crystal face other than the m-face, and forming an exciting electrode on each of front and back main surfaces of the exciting part.

As described above, each of the side surfaces in the longitudinal direction of the AT cut quartz crystal resonator element according to the above aspect of the invention can be processed in a manner that the m-face of the quartz crystal and the crystal face other than the m-face which makes an angle of about 3 degrees with respect to the normal direction of the main surface of the exciting part are exposed, by utilizing etching anisotropy that etching speed of the quartz is different according to crystal orientation. Differently from the existing machining process, the wet etching requires easy control in process and results in a narrow range of variation in a shape and a size, thereby enabling improvement in productivity and reduction in cost.

In the aspect, the outline processing includes forming masks corresponding to an outline of the exciting part on both the front and back surfaces of the AT cut quartz crystal plate and performing a wet etching to the AT cut quartz crystal plate from both the front and back surfaces using the masks; and the mask at a side of the front surface of the AT cut quartz crystal plate and the mask at a side of the back surface are placed by being shifted from each other in a Z'-axis direction of the quartz crystal, so that each of the side surfaces in the direction of the long side can be processed. The possibility of damaging the quartz crystal substrate can be eliminated since overetching required in the existing technology is unnecessary.

Herein, placing the masks by shifting them from each other in the Z'-axis direction is explained in more detail. The masks are placed by being shifted from each other on both the main surfaces of the quartz crystal substrate, respectively, in a manner that the mask is superposed on the other mask at an end portion at a side where the m-face is exposed by the wet etching while the mask is not superposed on the other mask at an end portion where the crystal face other than the m-face is exposed.

In this case, where the mask shift amount $\Delta z$ ($\mu m$) is, on the condition that a thickness of the AT cut quartz crystal plate is set to T ($\mu m$), set within a range of $\Delta z = 0.75 \times T \pm 20\%$, such a possibility is eliminated that the masks are shifted from each other too much or are not shifted enough, so that the side surfaces in the direction of the long side can be processed surely and effectively in a shorter time.

In another aspect, the method for manufacturing an AT cut quartz crystal resonator element further includes forming the thick center portion and the thin surrounding portion provided with the exciting electrode in a manner that each side surface in the longitudinal direction of a step between the thick center portion and the thin surrounding portion is composed of an m-face of the quartz crystal and a crystal face other than the m-face, by performing the wet etching to each of the front and back surfaces of the quartz crystal element piece having the outline processed. Thus, not only the mesa shape that produces the vibration energy trapping effect can be formed but also the AT cut quartz crystal resonator element can be achieved, that the unnecessary wave in such as the width-shear mode can be reduced and spurious response can be decreased.

Furthermore, where the wet etching is performed to each of the front and back surfaces of the quartz crystal element piece in a manner that a difference in a thickness between the thick center portion and the thin surrounding portion is set to smaller than or equal to 10% of a thickness of the thick center portion at the time of formation of the thick center portion and the thin surrounding portion, the thin surrounding portion is made thicker to improve a mechanical strength and the etching amount is reduced to prevent negative effects on the quartz crystal plate while the vibration energy trapping effect and an effect of the unnecessary wave reduction are maintained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
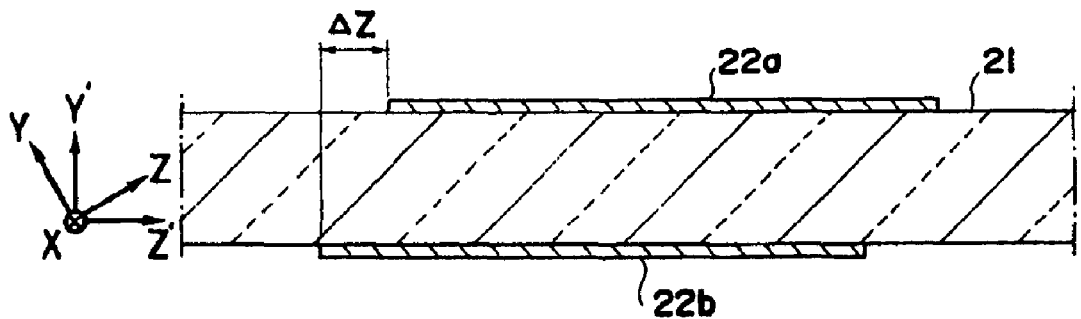
FIGS. 1A through 1C are views showing procedural steps for processing an outline of an AT cut quartz crystal element by a method according to this invention.
Figure 1B:
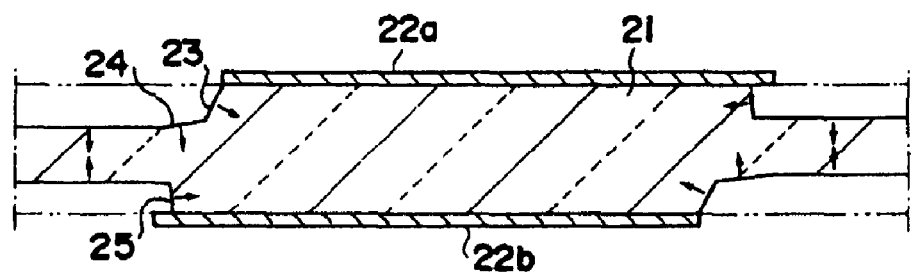
Figure 1C:
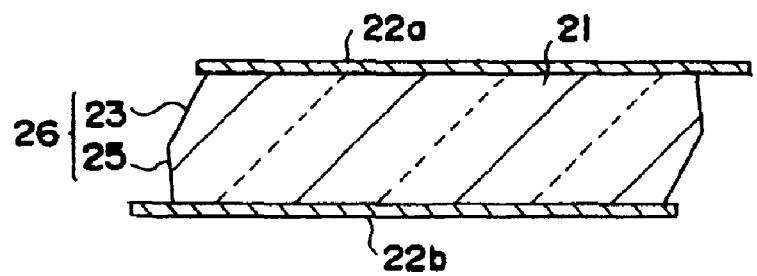

Hereinafter, preferred embodiments according to this invention will be explained with reference to accompanying drawings. FIGS. 1A through 1C show in order of procedural steps a process of processing an outline of an AT cut quartz crystal element by a method according to this invention. In this embodiment, right-handed quartz is used as shown in drawings, and an outline of a quartz crystal element piece is processed in a manner that an X-axis direction of the quartz is set to a long side and a Z'-axis direction is set to a thickness. First, an AT cut quartz crystal is subjected to a lapping process or the like to prepare an AT cut quartz crystal substrate 21 having a desired flat surface and thickness. First, masks 22a, 22b are formed on both upper and lower main surfaces of the quartz crystal substrate 21 by performing vapor deposition of a Cr film and an Au film each having a predetermined thickness and then photo-etching, as shown in FIG. 1A. At this time, the mask 22a at a front side of the substrate is placed in a manner to be shifted from a mask 22b at a back side by the certain amount Δz (μm) in the Z'-axis direction of the quartz crystal.

Next, a wet etching is performed to the quartz crystal substrate 21 from both surfaces using appropriate etchant such as ammonium fluoride solution. Because of etching anisotropy of the quartz, first to third crystal faces 23, 24, 25 of the quartz, which are tilted at different angles with respect to the AT cut surface, are exposed on an exposed surface of the quartz crystal substrate 21, as shown in FIG. 1B. In FIG. 1B, the first crystal face 23 as an m-face and the second crystal face 24 as an r-face both defined as a natural face peculiar to the quartz are formed to a negative side in the Z'-axis direction at an upper surface side of the quartz crystal substrate 21 in a manner that boundaries of the first and second crystal faces 23, 24 are in contact with each other. The third crystal face 25 as a natural face of the quartz other than the m-face is formed to a positive side in the Z'-axis direction. Symmetrically to these three faces with respect to a point, the first crystal face 23 as the m-face of and the second crystal face 24 as the r-face of the quartz crystal are formed to a positive side in the Z'-direction at a lower surface side of the quartz crystal substrate 21 in a manner that boundaries of the first and second crystal faces 23, 24 are in contact with each other, and the third crystal face 25 as the natural face of the quartz other than these faces 23, 24 is formed to a negative side in the Z'-axis direction. The etching is further performed to the exposed surface of the quartz crystal substrate 21 as pointed by arrows in FIG. 1B to completely pass through a part of the quartz where a mask is not formed, thereby resulting in formation of side surfaces 26 in a longitudinal direction, as shown in FIG. 1C.

As described above, the masks 22a, 22b are placed in a manner that the mask is superposed on the other mask at an end portion at a side where the first crystal face 23, i.e., the m-face is exposed while the mask is not superposed on the other mask at an end portion at a side where the third crystal face 25 is exposed. Therefore, each of the side surfaces 26 composed of two faces, i.e., the first crystal face 23 and the third crystal face 25, can be formed without allowing a projection such as caused by the existing technology due to difference in etching speed between the crystal faces. In this specification, the masks are placed on both the main surfaces of the quartz crystal substrate, respectively, in a manner that one mask is shifted from the other mask in the Z'-axis direction. As a result, the possibility of damaging the quartz crystal substrate can be eliminated since overetching is unnecessary according to this invention.

The mask shift amount Δz (μm) is set, on the condition that a thickness of the quartz crystal substrate 21 is set to T (μm), within a range of Δz=0.75×T±20%. This calculating expression is empirically derived from etching speed of each of the crystal faces of the quartz. The ratio between the first crystal face 23 and the third crystal face 25 composing each of the side surfaces can be varied by selecting appropriately a value of the mask shift amount Δz which has a range to a certain extent.

Figure 2A:
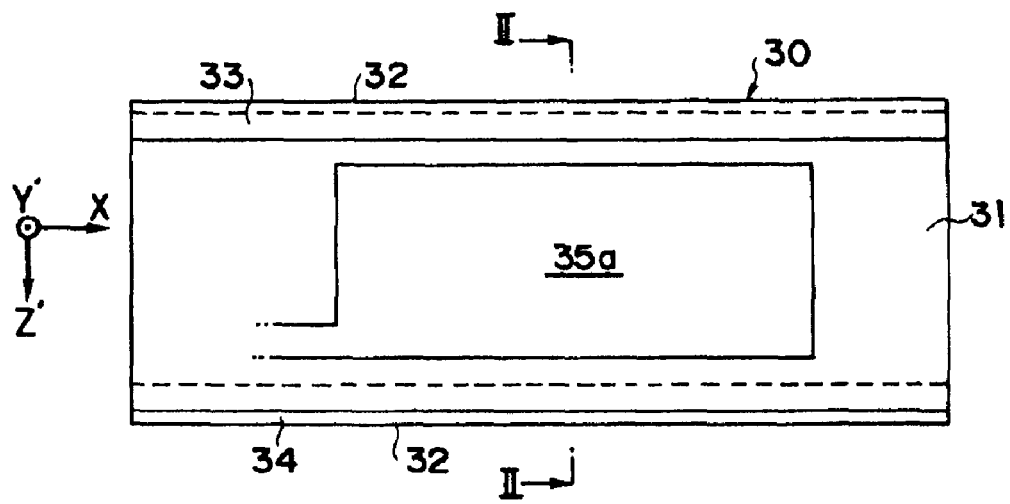
FIG. 2A is a plan view showing an embodiment of the AT cut quartz crystal element according to this invention.
Figure 2B:
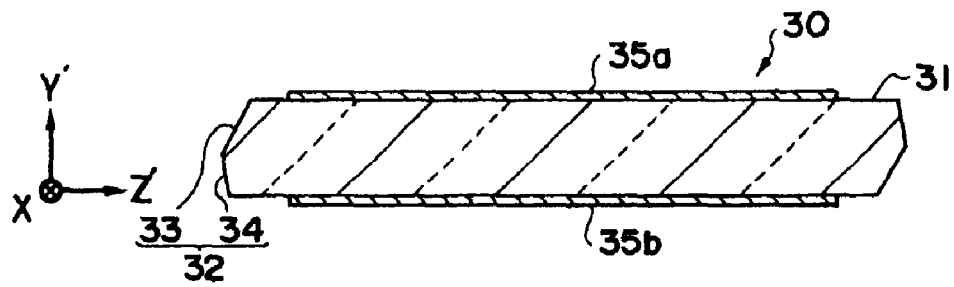
FIG. 2B is a cross-sectional view of FIG. 2A along the line II-II.

FIGS. 2A, 2B show a preferred embodiment of the AT cut quartz crystal resonator element according to this embodiment. An outline of this AT cut quartz crystal resonator element 30 is processed in accordance with the procedural steps shown in FIGS. 1A through 1C and has a rectangular quartz crystal element piece 31 in which the X-axis direction of the quartz crystal is set to a long side and the Z'-axis direction is set to a short side. Each of side surfaces 32 in the longitudinal direction of the quartz crystal element piece is composed of two faces, i.e., a first crystal face 33 and a third crystal face 34 of the quartz which are the same as the first and third crystal faces 23, 25 in FIGS. 1A through 1C. At each of end edges in the longitudinal direction of the quartz crystal resonator element 30, the crystal faces 33, 34 are different in a tilt angle, thereby causing difference in position where these faces intersect with each other between the end edges and difference in position where the these faces intersect with the main surfaces between the front and back main surfaces of the quartz crystal element piece 31. Thus, a visual recognition can be easily made where a flat surface of the quartz crystal resonator element 30 such as shown in FIG. 2A is viewed, because of refraction of light resulting from the difference in a tilt angle. Therefore, even the downsized quartz crystal resonator element 30 offers good individual visibility, thereby improving workability in assembly and handling. The front and back main surfaces of the quartz crystal element piece 31 are provided with a pair of exciting electrodes 35a, 35b, respectively.

Figure 2C:
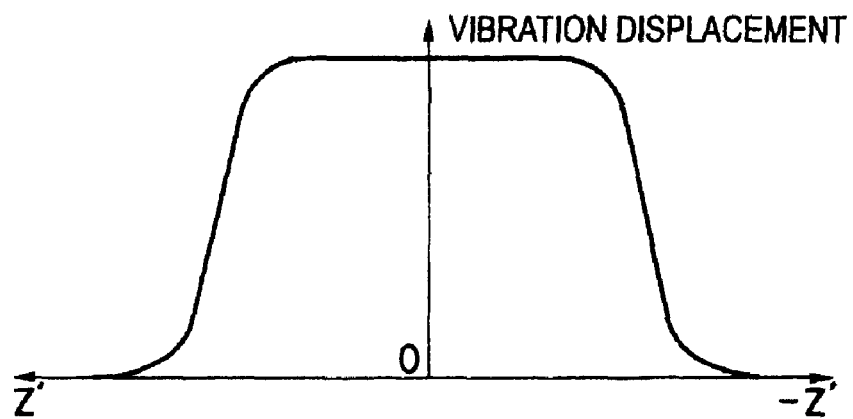
FIG. 2C is a graph showing vibration displacement distribution in a Z'-axis direction, i.e., a width direction in FIGS. 2A and 2B.

FIG. 2C shows vibration displacement in the width direction, i.e., the Z' direction of the AT cut quartz crystal resonator element 30. As is clear from FIG. 2C, in the quartz crystal resonator element according to this invention, the vibration attenuates sharply at both ends in the width direction. Therefore, the quartz crystal resonator element produces the sufficiently large energy trapping effect, so that the frequency characteristics such as the CI value and the C value can be improved greatly.

In the AT cut quartz crystal resonator element 30, since each of side surfaces 32 in the longitudinal direction includes the third crystal face 34, which is tilted at an angle of 3 degrees with respect to the normal direction of the main surface, to be more precise, 3 degrees±30 minutes in consideration of errors in process, as described in JP-A-2005-94410, a union between a width-shear vibration mode and a thickness-shear vibration mode becomes smaller than that in the case where the tilt angle of the side surface is set to 0 degrees. Therefore, improvement can be promoted in frequency temperature characteristics in addition to the energy trapping effect.

Figure 3A:
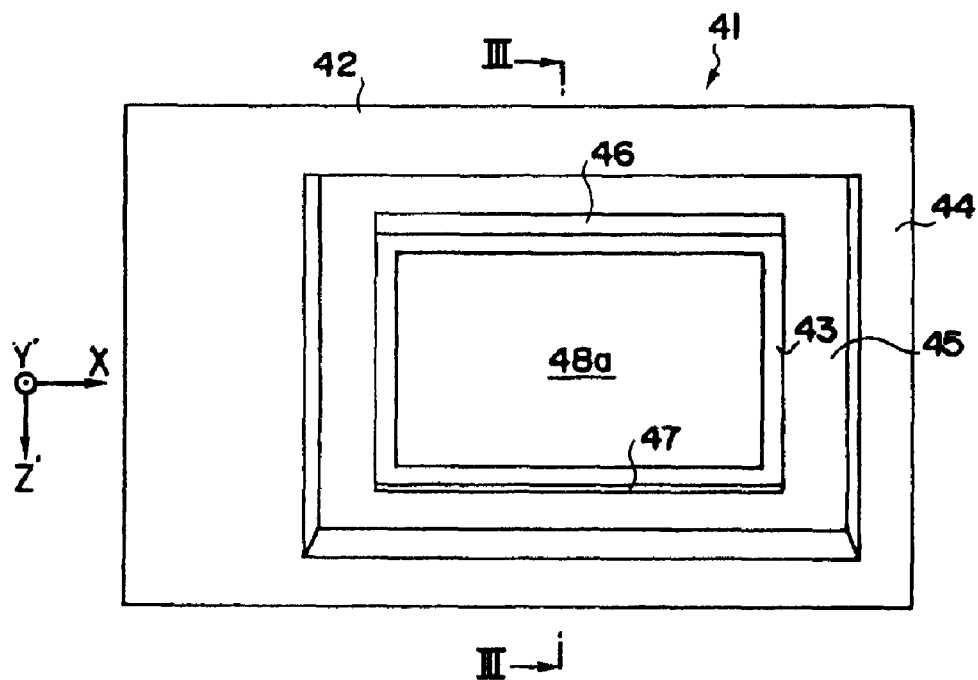
FIG. 3A is a plan view showing another embodiment of the AT cut quartz crystal element according to this invention.
Figure 3B:
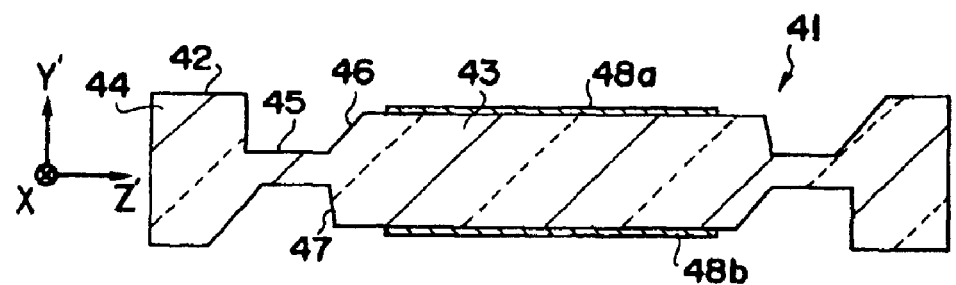
FIG. 3B is a cross-sectional view of FIG. 3A along the line

FIGS. 3A, 3B show another embodiment of the AT cut quartz crystal resonator element according to this invention. An AT cut quartz crystal resonator element 41 in this embodiment includes a quartz crystal element piece 42 in an inverted mesa shape. In other words, the quartz crystal element piece 42 includes a comparatively thin resonating part 43 in a rectangular shape in a center of the quartz crystal element piece 42 and a thick reinforcing frame 44 in a rectangular shape placed in a manner to surround the resonating part 42. The entire outer edge of the resonating part 43 is coupled in a united manner to the reinforcing frame 44 through a coupling part 45 which is thinner than the resonating part 43.

The quartz crystal element 42 is formed in accordance with processing steps similar to those in FIGS. 1A through 1C in a manner that a long side of the resonating part 43 is set to the X-axis direction of the quartz. Therefore, each side surface in the longitudinal direction of the resonating part 43 is composed of two faces, i.e., a first crystal face 46 and a third crystal face 47 of the quartz which are each the same as the first and third crystal faces 23, in FIG. 1A through 1C. The front and back main surfaces of the resonating part 43 are provided with a pair of exciting electrodes 48a, 48b, respectively. Thus, in a manner similar to the AT cut quartz crystal resonator element in FIGS. 2A, 2B, the AT cut quartz crystal resonator element 41 can be improved in the energy trapping effect to promote improvement in the frequency characteristics, so that the frequency characteristics can be improved by reducing the effect of the width-shear vibration mode.

Figure 4A:
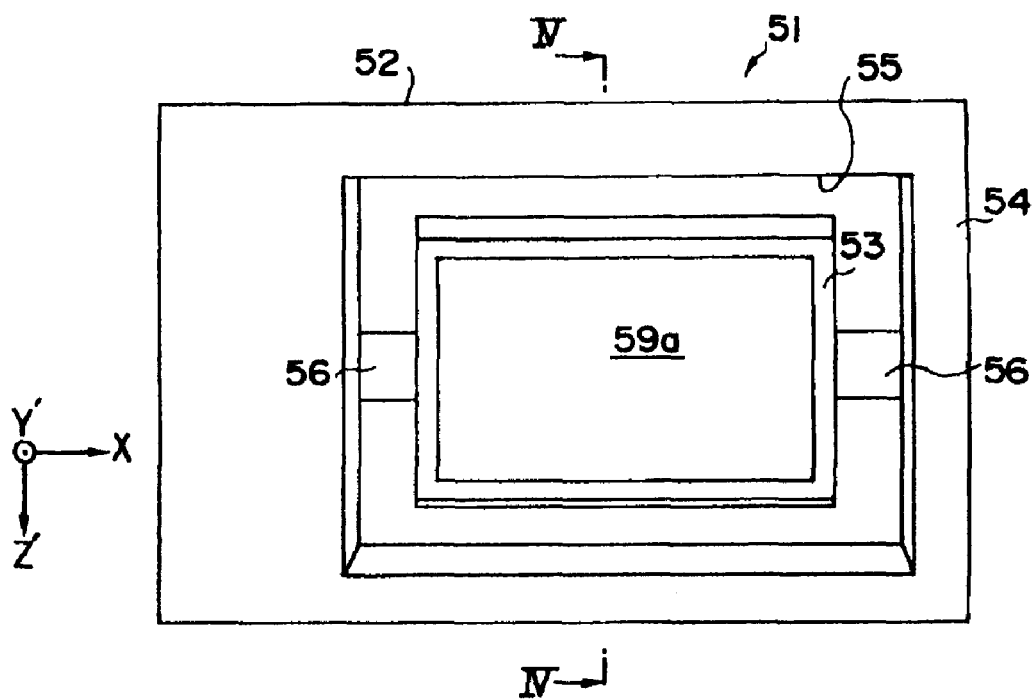
FIG. 4A is a plan view showing a modification example of the AT cut quartz crystal element according to this invention.
Figure 4B:
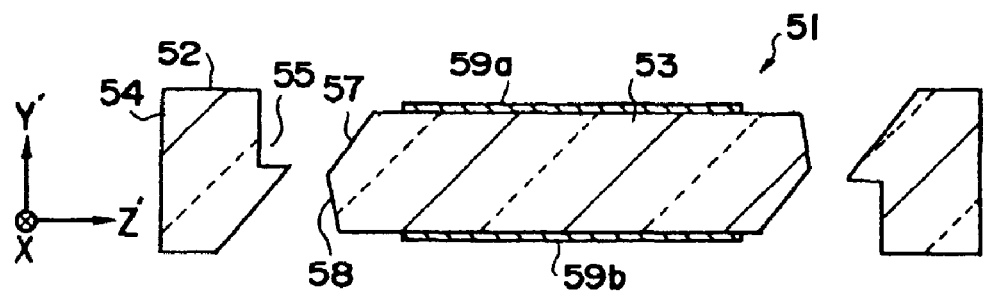
FIG. 4B is a cross-sectional view of FIG. 4A along the line IV-IV.

FIGS. 4A, 4B show a modification example of the AT cut quartz crystal resonator element in FIGS. 3A, 3B. An AT cut quartz crystal resonator element 51 in this embodiment includes a quartz crystal element piece 52 in an inverted mesa shape similar to that shown in FIGS. 3A, 3B. However, a penetrating flute 55 is formed between the a comparatively thin resonating part 53 in a rectangular shape in a center of the quartz crystal element piece 52 and a thick reinforcing frame 54 in a rectangular shape placed in a manner to surround the resonating part 53, and the resonating part 53 and the reinforcing part 54 are coupled in a united manner through coupling parts 56.

The quartz crystal element piece 52 is formed in accordance with processing steps similar to those in FIGS. 1A through 1C in a manner that a long side of the resonating part 53 is set to the X-axis direction of the quartz. Therefore, each side surface in the longitudinal direction of the resonating part 53 is composed of two faces, i.e., a first crystal face 57 and a third crystal face 58 of the quartz which are each the same as the first and third crystal faces 23, in FIG. 1A through 1C. The front and back main surfaces of the quartz crystal element piece 53 are provided with a pair of exciting electrodes 59a, 59b, respectively. Thus, in a manner similar to the AT cut quartz crystal resonator element in FIGS. 2A, 2B, the AT cut quartz crystal resonator element 41 can be improved in the energy trapping effect to promote improvement in the frequency characteristics, so that the frequency characteristics can be improved by reducing the effect of the width-shear vibration mode.

Figure 5A:
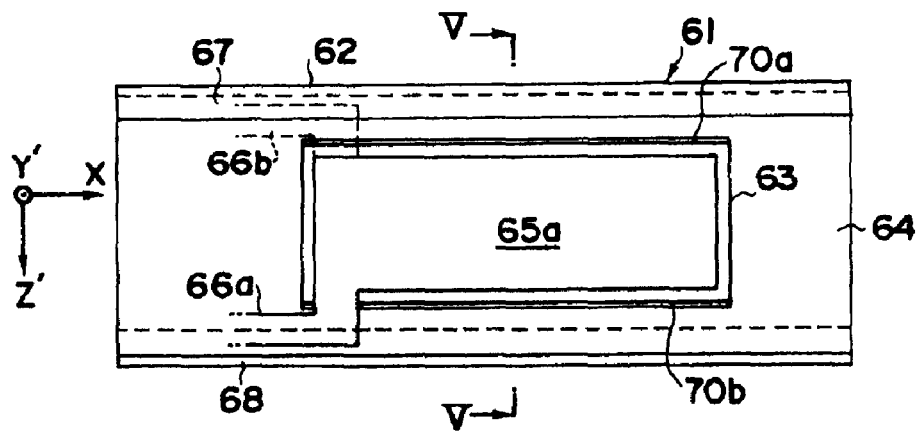
FIG. 5A is a plan view showing a yet another embodiment of the AT cut quartz crystal element according to this invention.
Figure 5B:
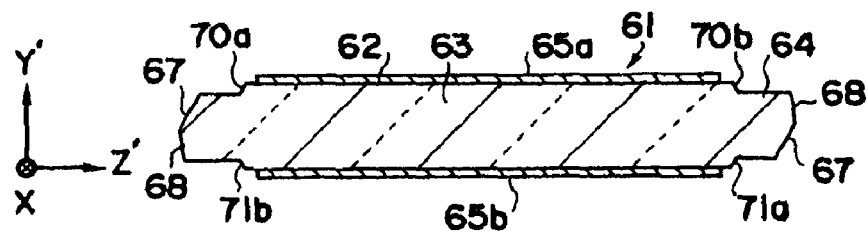
FIG. 5B is a cross-sectional view of FIG. 4A along the line V-V.

FIGS. 5A, 5B show yet another embodiment of the AT cut quartz crystal resonator element according to this invention. An AT cut quartz crystal resonator element 61 includes a quartz crystal element piece 62 in a mesa shape. In other words, the quartz crystal element 62 includes a thick center portion 63 as the resonating part and a thin surrounding portion 64 surrounding the center portion 63. In this embodiment, this mesa shape further improves the energy trapping effect to enhance the frequency characteristics, so that the frequency characteristics can be improved by reducing the width-shear vibration mode. The front and back main surfaces of the quartz crystal element piece 63 are provided with a pair of exciting electrodes 65a, 65b, respectively. Each of the exciting electrodes is electrically connected to a connection electrode, not shown, formed at one end in the longitudinal direction of the quartz crystal element piece 62, through each of leads 66a, 66b extending from the thick center portion 63.

In a manner similar to each of the above embodiments, the outline of the quartz crystal element piece 62 is processed in a rectangular shape in accordance with processing steps in FIGS. 1A through 1C such that the X-axis direction of the quartz crystal is set to a long side and the Z'-axis direction is set to a short side. Each of side surfaces in the longitudinal direction of the quartz crystal element piece 62 is composed of two faces, i.e., a first crystal face 67 and a third crystal face 68 of the quartz which are each the same as the first and third crystal faces 23, in FIG. 1A through 1C.

Figure 6A:
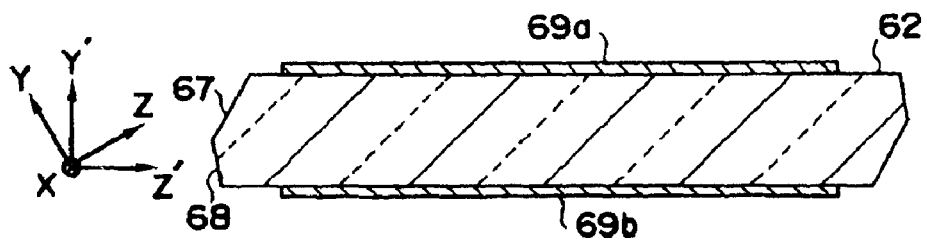
FIGS. 6A and 6B are views showing procedural steps in order for processing a thick center portion of the AT cut quartz crystal element in FIGS. 5A and 5B.
Figure 6B:
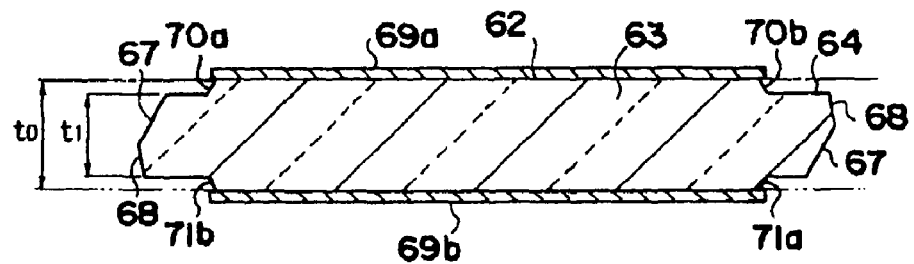
Figure 7A:
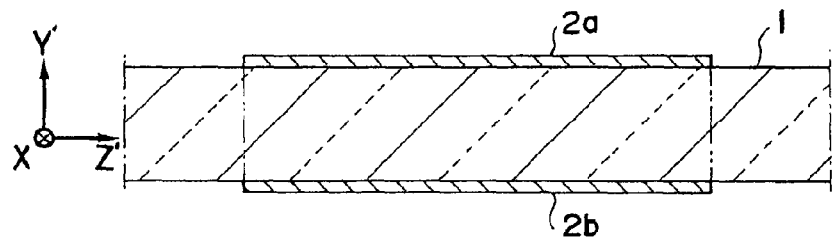
FIGS. 7A through 7D are views showing procedural steps in order for processing the outline of the AT cut quartz crystal element by an existing method.
Figure 7B:
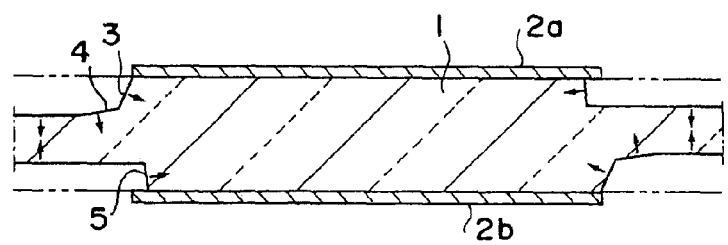
Figure 7C:
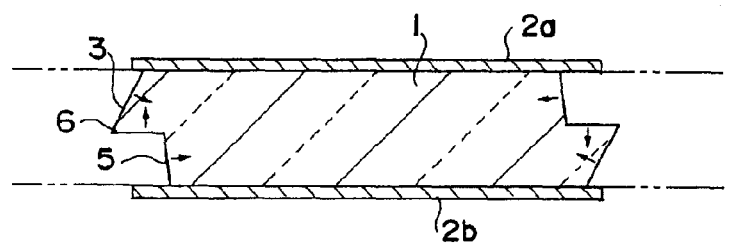
Figure 7D:
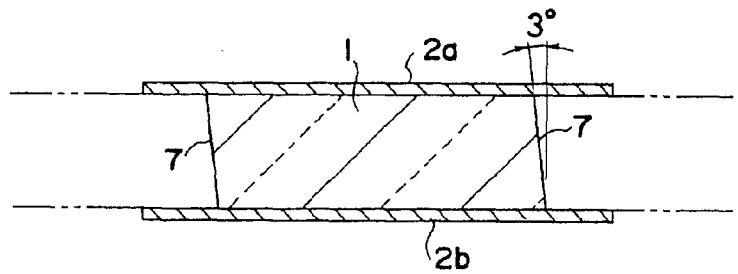
Figure 8A:
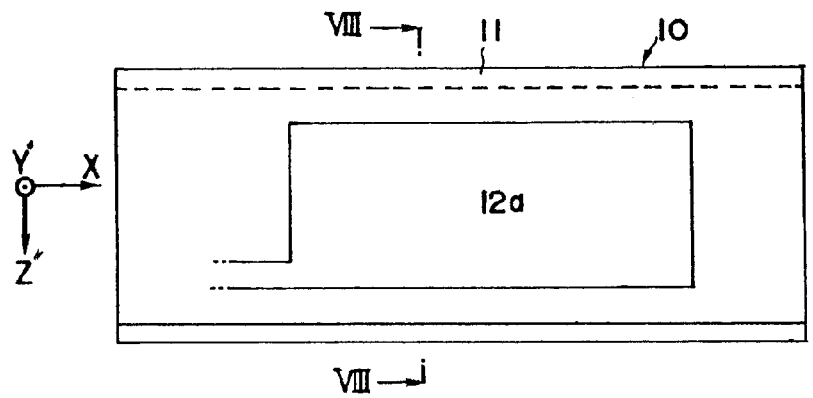
FIG. 8A is a plan view showing an AT cut quartz crystal resonator element according to an existing technology.
Figure 8B:
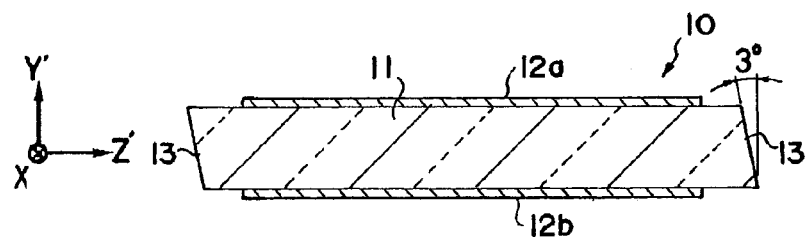
FIG. 8B is a cross-sectional view of FIG. 8A along the line VIII-VIII.
Figure 8C:
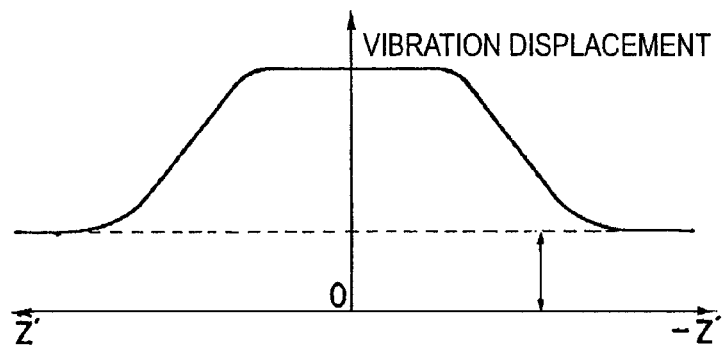
FIG. 8C is a graph showing vibration displacement distribution in a Z'-axis direction, i.e., a width direction in FIGS. 8A and 8B.

Next, the quartz crystal element piece 62 is provided with the thick center portion 63 and the thin surrounding portion 64 by the wet etching. As shown in FIG. 6A, masks 69a, 69b are formed on both front and back surfaces of the quartz crystal element piece 62 having the outline processed, by performing vapor deposition of a Cr film and an Au film each having a predetermined thickness and then photo-etching. Each of the front and back surfaces of the quartz crystal element piece 62 is subjected to the wet etching using appropriate etchant such as ammonium fluoride solution. In the quartz crystal element piece 62, the exposed part is made thinner while steps are formed in boundaries between the exposed surface and portions covered with masks, as shown in FIG. 6B.

At side surfaces of steps 70a, 70b, 71a, 71b extending in the longitudinal direction of the quartz crystal element piece 62, the first through third crystal faces of the quartz are exposed because of the etching anisotropy as described above in association with FIG. 1B, in which the first through third crystal faces are tilted at different angles with respect to the AT cut surface. At an upper surface side of the quartz crystal element piece 62, the first crystal face as the m-face of the quartz crystal and the second crystal face as the r-face are formed to the step 70a at a negative side in the Z'-axis direction in a manner that boundaries of these first and second crystal faces are in contact with each other, while the third crystal face as a natural face of the quartz other than the m-face is formed to the step 70b at a positive side in the Z'-axis direction. Symmetrically to these three faces with respect to a point, the first crystal face as the m-face of the quartz crystal and the second crystal face as the r-face are formed to the step 71a at a positive side in the Z'-axis direction in a manner that boundaries of these first and second crystal faces are in contact with each other, while the third crystal face as a natural face of the quartz other than these faces is formed to the step 71b at a negative side in the Z'-axis direction. As described above, predetermined quartz crystal faces are exposed at the side surfaces of the steps 70a, 70b, 71a, 71b, thereby solving or reducing manufacturing variations of shape of the thick center portion 63.

The small-sized steps are enough between the thick center portion 63 and the thin surrounding portion 64 as long as the unnecessary waves such as the width-shear mode, which superposes on the main vibration in the thickness-shear mode, can be reduced, even where the vibration energy trapping effect is reduced. In this embodiment, on the condition that thicknesses of the thick center portion 63 and the thin surrounding portion 64 are set to t0 and t1, respectively, as shown in FIG. 6B, these thicknesses are set such that a difference t0–t1 is smaller than or equal to 10% of the thickness t0 of the thick center portion. Thus, the thin surrounding portion 64 can be formed thicker, thereby increasing the mechanical strength. The quartz crystal resonator element 61 is mounted in a cantilever manner, in which one end portion in the longitudinal direction, i.e., the thin surrounding portion 64 is generally fixed, thereby enabling firm and secured fixation. Furthermore, since formation in the mesa shape reduces the etching amount, such a negative effect of the wet etching, that may affect on the quartz material, for example, occurrence of etch pit, can be reduced.

In this embodiment also, there is the fear that positions of end edges of the thick center portion 63 at the front and back surfaces of the quartz crystal element piece 62 are slightly shifted and misaligned from each other in the Z'-axis direction of the quartz crystal where the wet etching is performed to the thin surrounding portion 64 by aligning upper and lower positions of the masks 69a, 69b with each other. However, in the case of the small etching amount in a manner similar to this embodiment, the misalignment between the end edges of the thick center portion 63 at the upper and lower positions is small enough to be neglected. In the case of the large etching amount, the upper and lower positions of the masks 69a, 69b can be shifted from each other in the Z'-axis direction correspondingly.

After the masks 69a, 69b are removed from the front and back surfaces of the quartz crystal element piece 62 formed in the mesa shape, the Cr film and the Au film having a predetermined thickness, for example, are formed by the vapor deposition or the like to form the electrode films again. These electrode films are patterned by the photolithography technology to form the exciting electrodes 65a, 65b, leads 66a, 66b, and the connection electrode. In this embodiment, the leads 66a, 66b are formed in a manner to extend from the end edge in the X-axis direction of the thick center portion 63. The m-face and the r-face of the quartz crystal or the crystal face other than the m-face are exposed at the steps 70a, 70b, 71a, 71b, in the X-axis direction, so that all the end edges in the X-axis direction have an obtuse angle. Therefore, such a possibility is eliminated that the leads 66a, 66b are broken at angles of the steps or a film cannot be formed thick enough, so that the electrical characteristics can be ensured while the reliability can be improved.

The preferred embodiments according to this invention were explained in the above but this invention can be carried out by adding various modifications and changes to the above embodiments. For example, both the surfaces of the quartz crystal substrate are subjected to the wet etching at the same time in the above embodiments but can be subjected to the etching one by one. Furthermore, not only the right-handed quartz but also left-handed quartz can be applied for this invention. In that case also, side surfaces in the longitudinal direction, each composed of two faces, i.e., the first and third crystal faces can be formed in the X-axis direction by shifting the masks placed on the front and back main surfaces of the quartz crystal substrate from each other in the Z'-axis direction. Furthermore, as the masks and the electrode films formed on the front and back surfaces of the quartz crystal element piece, respectively, various metals and electrode materials in the public domain can be used other than the Cr film and the Au film.

The entire disclosure of Japanese Patent Application Nos: 2006-217046, filed Aug. 9, 2006 and 2007-086197, filed Mar. 29, 2007 are expressly incorporated by reference herein.

What is claimed is:

1. An AT cut quartz crystal resonator element comprising:
   a quartz crystal element comprising:
   a rectangular excitation part, which comprises AT cut quartz crystal and in which an X-axis direction of quartz crystal crystallization is a long side; and
   a reinforcing part, which is arranged at a periphery of the rectangular excitation part and whose thickness is thicker than that of the excitation part; and
   an excitation electrode, which is arranged on front and rear main surfaces of the excitation part,
   the excitation part being integrally coupled with the thick reinforcing part, by a coupling part whose thickness is thinner than that of the excitation part; and
   both side surfaces of the excitation part in a long side direction being respectively constituted by two faces, which are an m-face and a crystal face other than the m-face.

2. The AT cut quartz crystal resonator element as set forth in claim 1,
   a through hole being arranged between the excitation part and the thick reinforcing part.

3. The AT cut quartz crystal resonator element as set forth in claim 2,
   the crystal face other than the m-face being inclined at an angle of 3°±30' with respect to a normal line direction of the main surface of the excitation part.

4. The AT cut quartz crystal resonator element as set forth in claim 1,
   the crystal face other than the m-face being inclined at an angle of 3°±30' with respect to a normal line direction of the main surface of the excitation part.

* * * * *